(12) United States Patent
Iwasaki

(10) Patent No.: US 6,249,235 B1
(45) Date of Patent: Jun. 19, 2001

(54) SAMPLING FREQUENCY CONVERSION APPARATUS AND FRACTIONAL FREQUENCY DIVIDING APPARATUS FOR SAMPLING FREQUENCY

(75) Inventor: Motoya Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/533,601

(22) Filed: Mar. 23, 2000

Related U.S. Application Data

(62) Division of application No. 09/038,612, filed on Mar. 11, 1998.

(30) Foreign Application Priority Data

Mar. 12, 1997 (JP) .......................................... 9-74709

(51) Int. Cl.[7] .............................. H03M 1/00; H03L 7/00; H03B 1/00
(52) U.S. Cl. .............................. 341/123; 331/16; 331/74; 708/103
(58) Field of Search ................................ 331/1 A, 25, 16, 331/48, 74, 51, 32; 341/61, 123; 327/105, 107; 708/103, 313

(56) References Cited

U.S. PATENT DOCUMENTS

| | | | |
|---|---|---|---|
| 4,656,649 | 4/1987 | Takahashi | 377/48 |
| 5,485,152 | 1/1996 | Wilson et al. | 341/61 X |
| 5,513,209 | 4/1996 | Holm | 341/61 X |
| 5,559,513 * | 9/1996 | Rothermel et al. | 341/61 |

FOREIGN PATENT DOCUMENTS

| | | |
|---|---|---|
| 0512619 | 11/1992 | (EP) . |
| 06252749 | 9/1994 | (JP) . |

OTHER PUBLICATIONS

European Search Report issued Aug. 25, 2000, in a related application (in English).

* cited by examiner

Primary Examiner—Patrick Wamsley
(74) Attorney, Agent, or Firm—Ostrolenk, Faber, Gerb & Soffen, LLP

(57) ABSTRACT

The invention provides a sampling frequency conversion apparatus which converts a sampling frequency to another frequency using another oscillator employed in the system as the source oscillator. A fractional frequency divider divides an output of the source oscillator by a non-integer. By using outputs of the source oscillator and the divider individually as sampling clocks, an input signal is first sampled by a first sampling circuit and then an output of the first sampling circuit is sampled again by a second sampling circuit to convert the sampling frequency. The fractional frequency divider divides the clock signal of a higher one of the frequencies to produce the clock signal of a lower one of the frequencies, and the dividing ratio of the fractional frequency divider for the production of the clock signal is varied periodically to effect division of a frequency ratio having a fractional value when averaged over a time period.

4 Claims, 7 Drawing Sheets

SAMPLING FREQUENCY CONVERSION APPARATUS AND FRACTIONAL FREQUENCY DIVIDING APPARATUS FOR SAMPLING FREQUENCY

This is a divisional of application Ser. No. 09/038,612, filed Mar. 11, 1998.

BACKGROUND OF THE INVENTION

1. Field of the Invention

The present invention relates to a conversion apparatus for a sampling frequency in digital signal processing, and more particularly to a sampling frequency conversion apparatus and a fractional frequency dividing apparatus for sampling frequency conversion by which the ratio between frequencies before and after frequency conversion can be set to a non-integer.

2. Description of the Related Art

A sampling frequency conversion apparatus which samples a signal obtained by sampling an original signal with a different sampling frequency again is conventionally known and disclosed, for example, in Japanese Patent Laid-Open Application No. Heisei 6-252749.

FIG. 4 shows a conventional sampling frequency conversion apparatus of the type mentioned above. Referring to FIG. 4, the sampling frequency conversion apparatus shown can provide a plurality of combinations between the sampling frequency of input data and the sampling frequency of output data. In order to generate a clock signal for sampling, a PLL circuit composed of a phase comparator 41, a voltage-controlled oscillator 42 and a frequency divider 43 is used.

The sampling frequency conversion apparatus adopts such a construction that a signal obtained by sampling an original signal with a clock signal of a predetermined clock frequency is inputted as input data to an oversampling circuit 44 so that it is oversampled with a clock signal of another frequency higher than the sampling frequency.

The clock signal for oversampling the input data is inputted to the phase comparator 41 while an output of the voltage-controlled oscillator 42 is inputted to the phase comparator 41 after it is divided by the frequency divider 43 so that the phases of the clock signal and the divided signal are compared with each other by the comparator 41 to produce an error signal. Then, the voltage-controlled oscillator 42 is controlled with the error signal so that a clock signal corresponding to, but having a higher frequency than, the input clock signal is outputted as the clock signal for oversampling from the voltage-controlled oscillator 42 to the oversampling circuit 44.

The sampling frequency conversion apparatus described above has a restriction in that, since the original clock signal and the output of the voltage-controlled oscillator 42 are used as clock signals for sampling, when performing conversion of the sampling frequency utilizing the two clock signals, the ratio between frequencies before and after the frequency conversion must be an integer.

Therefore, with the sampling frequency conversion apparatus described above, where the frequency of the voltage-controlled oscillator side is determined from a demand from a system, there is a limitation in frequency of an oscillator serving as a source oscillator which oscillates the original or reference clock signal. Therefore, it is difficult to use another oscillator, which is used in the system, commonly as the source oscillator.

SUMMARY OF THE INVENTION

It is an object of the present invention to provide a sampling frequency conversion apparatus and a fractional dividing apparatus for sampling frequency conversion by which, when a sampling frequency is to be converted into another frequency, another oscillator used in a system can be used commonly as a source oscillator.

In order to attain the object described above, according to an aspect of the present invention, there is provided a sampling frequency conversion apparatus, comprising an oscillator for generating a clock signal for sampling, a fractional frequency divider for dividing the output clock signal of the oscillator at a non-integer frequency ratio, a first sampling circuit for sampling a signal inputted thereto with the output clock signal of the oscillator, and a second sampling circuit for sampling an output of the first sampling circuit with an output clock signal of the fractional frequency divider.

The sampling frequency conversion apparatus may be constructed such that an A/D converter is used for the first sampling circuit, and a digital filter is interposed between the A/D converter and the second sampling circuit.

According to another aspect of the present invention, there is provided a sampling frequency conversion apparatus, comprising an oscillator for generating a clock signal for sampling, a fractional frequency divider for dividing the output clock signal of the oscillator at a non-integer frequency ratio, a first sampling circuit for sampling a signal inputted thereto with an output clock signal of the fractional frequency divider, and a second sampling circuit for sampling an output of the first sampling circuit with the output clock signal of the oscillator.

The sampling frequency conversion circuit may be constructed such that a waveform shaping processing circuit is used for the first sampling circuit, the sampling frequency conversion apparatus further comprising a digital filter for filtering an output of the second sampling circuit and a D/A converter for converting an output of the digital filter into an analog signal.

With both of the sampling frequency conversion device described above, as a clock signal for sampling, a clock signal of a high frequency is divided to produce another clock signal of a low frequency, and the dividing ratio of a divider to be used for such division is periodically varied to a value to effect division of a frequency ratio having a fraction when averaged over a period of time. Consequently, since the clock signal of the high frequency is divided at a fractional dividing ratio to produce the clock signal of the low frequency and conversion of the sampling frequency is performed with the clock signals, when the sampling frequency is to be converted, the high frequency can be selected irrespective of the low frequency, and another oscillator which is used in the system can be used commonly as the source oscillator.

Further, as the frequency for the clock signal for sampling, either one of the high frequency and the low frequency can be selected arbitrarily, and the two clock signals are synchronized fully with each other. Therefore, although the frequencies before and after conversion of the sampling frequency do not present an integer ratio, the two signals are synchronized with each other.

According to a further aspect of the present invention, there is provided a fractional frequency divider for sampling frequency conversion, comprising a frequency divider for dividing a clock signal, a first selector for selectively loading N or N+1 as a value for determination of a dividing ratio to the frequency divider, an adder for receiving a fixed integer value L as a first input in response to an output of the frequency divider and adding the first input and a second input, a subtractor for subtracting another fixed integer value M larger than the fixed integer value L from an output of the adder, a second selector for selectively outputting the output of the adder or an output of the subtractor, a latch circuit for latching an output of the second selector in response to the clock signal divided by the frequency divider and supplying the latched output as the second input to the adder, and a comparator for controlling the first and second selectors depending upon whether or not the output of the subtractor is equal to or higher than zero or lower than zero.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
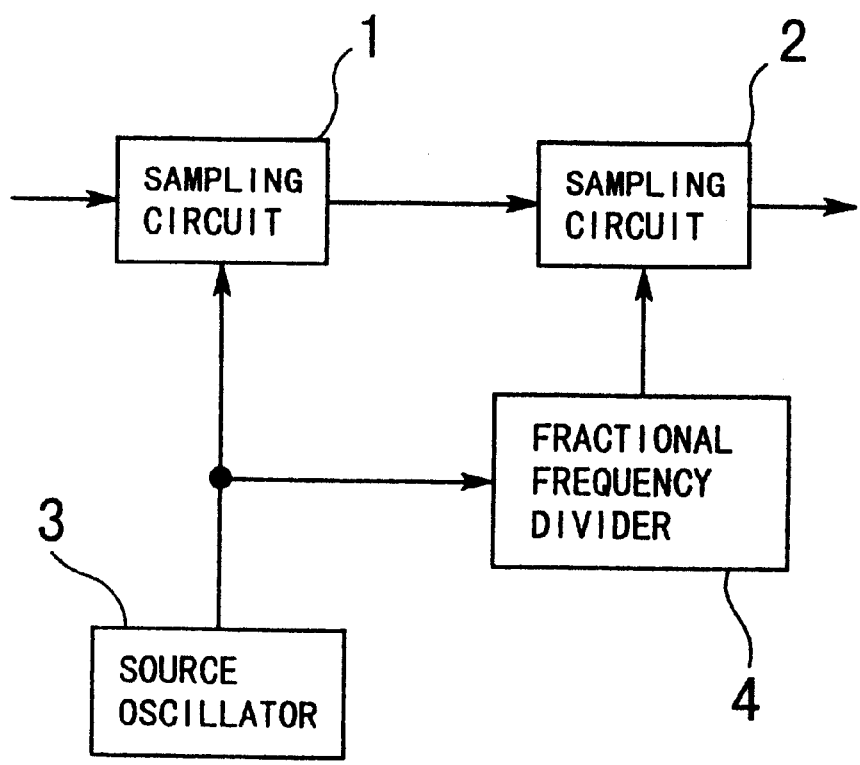
FIG. 1(A) is a block diagram of a sampling frequency conversion apparatus according to the present invention wherein a sampling frequency is converted from a high frequency to a low frequency.
FIG. 1(B) shows another sampling frequency conversion apparatus according to the present invention wherein a sampling frequency is converted from a low frequency to a high frequency.
FIG. 1(C) is a block diagram showing a construction of a fractional frequency divider according to the present invention which can be employed in the sampling frequency conversion apparatus of FIGS. 1(A) and 1(B)

Referring first to FIG. 1(A), there is shown a sampling frequency conversion apparatus according to the present invention wherein a sampling frequency is converted from a high frequency to a low frequency. The sampling frequency conversion apparatus shown includes two sampling circuits 1 and 2, and a source oscillator 3 and a fractional frequency divider 4 for supplying clock signals to the sampling circuits 1 and 2, respectively.

An input signal is first sampled with an output of the source oscillator 3, which is a clock signal of a high frequency, by the sampling circuit 1, and an output of the sampling circuit 1 is sampled by the sampling circuit 2 with a clock signal of a low frequency obtained by dividing the output of the source oscillator 3 by a non-integer having a fraction by means of the fractional frequency divider 4. Consequently, a sampling signal obtained by the conversion with the low sampling frequency is outputted from the sampling circuit 2 and consequently from the sampling frequency conversion apparatus.

Figure 1B:
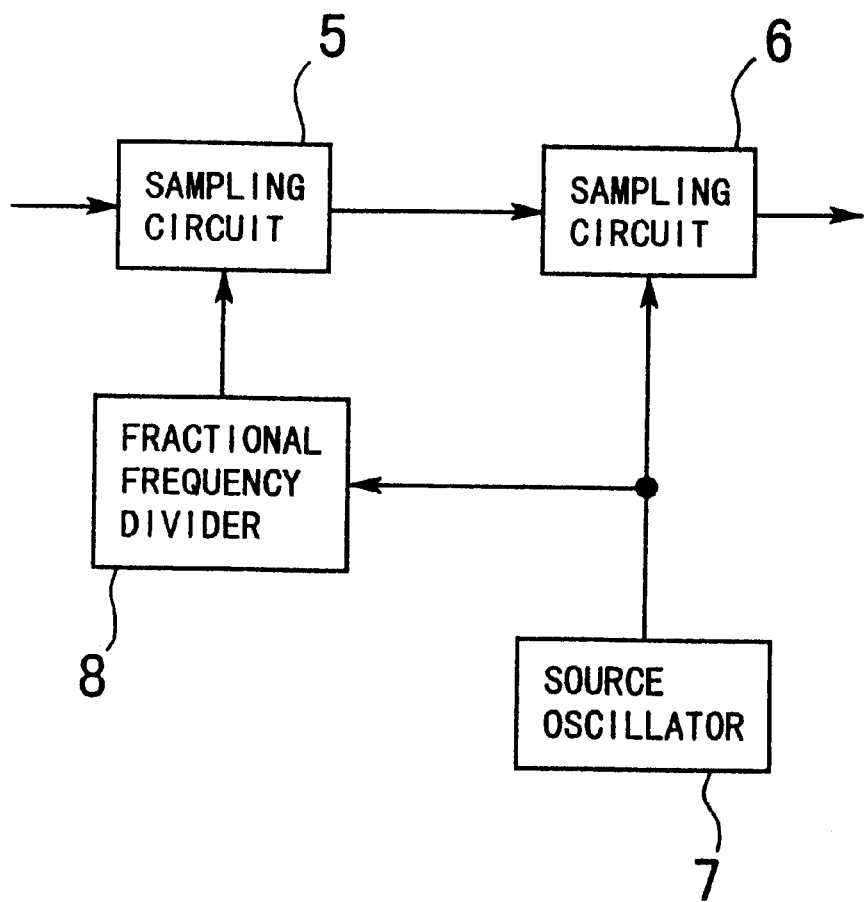

Referring now to FIG. 1(B), there is shown another sampling frequency conversion apparatus according to the present invention wherein a sampling frequency is converted from a low frequency to a high frequency. The sampling frequency conversion apparatus shown similarly includes two sampling circuits 5 and 6, and a source oscillator 7 and a fractional frequency divider 8.

An input signal is sampled by the sampling circuit 5 with a clock signal of a frequency obtained by dividing an output of the source oscillator 7 to a ratio having a fraction by means of the fractional frequency divider 8, and an output of the sampling circuit 5 is sampled with a frequency of the source oscillator 7 by the sampling circuit 6. Consequently, a sampling signal whose frequency has been converted into the high sampling frequency is outputted from the sampling circuit 6 and consequently from the sampling frequency conversion apparatus.

Figure 1C:
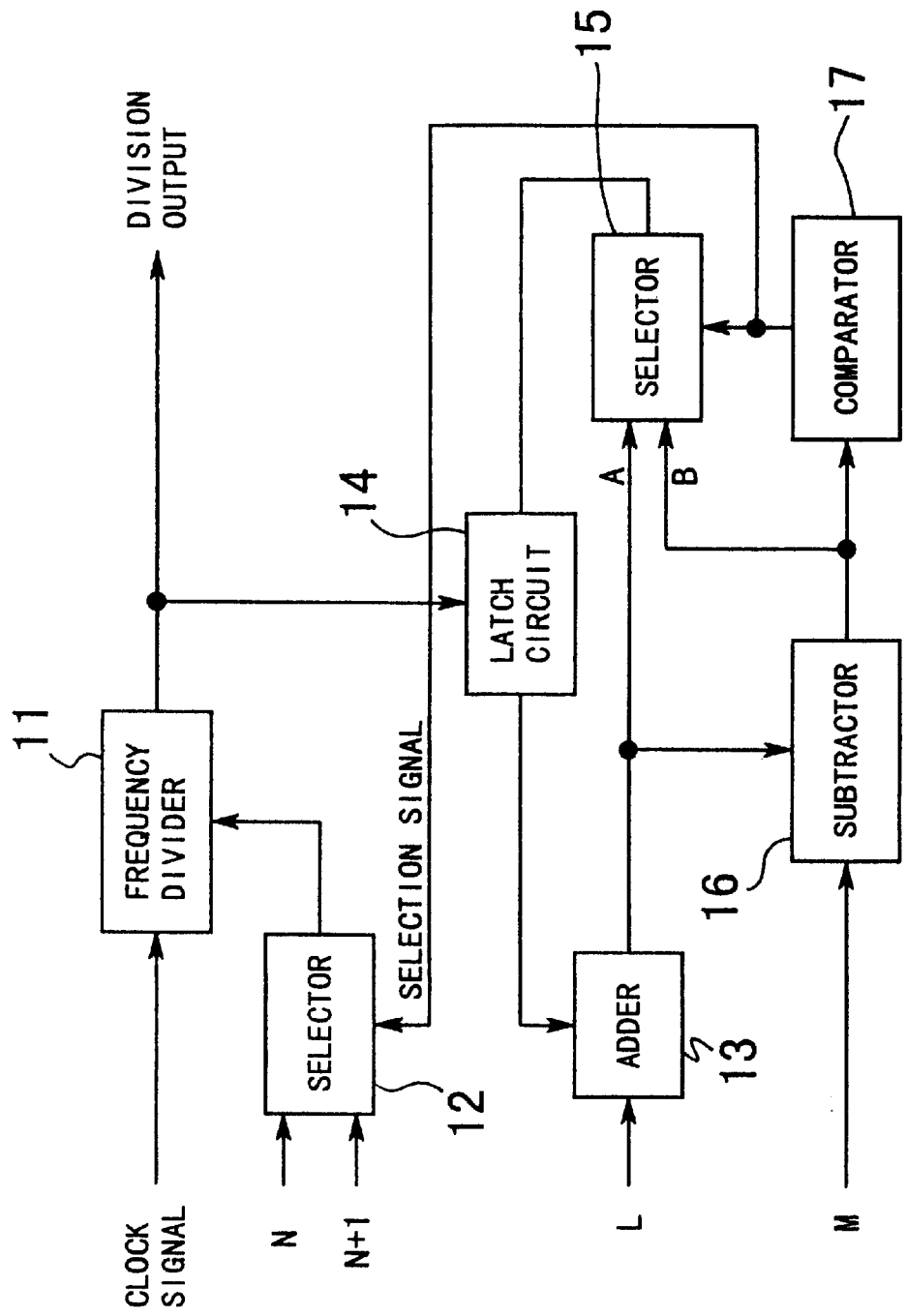

Referring now to FIG. 1(C), there is shown a fractional frequency divider according to the present invention which can be applied to the sampling frequency conversion apparatus described above with reference to FIGS. 1(A), and 1(B). The fractional frequency divider shown includes a frequency divider 11 for frequency dividing a clock signal at a selected one of dividing ratios of two different integers, a selector 12 for loading data of such selected dividing ratio to the frequency divider 11, and an adder 13, a latch circuit 14, a selector 15, a subtractor 16 and a comparator 17 for constitute of control circuit controlling the selector 12 to realize frequency division having a fractional value when averaged over a period of time.

The frequency divider 11 divides an input clock signal and outputs a clock signal of a frequency lower than the frequency of the input clock signal. The dividing ratio of the frequency divider 11 is controlled so as to be changed over by a predetermined condition. The selector 12 is a selection circuit which alternatively outputs N or N+1 (N is an integer) as division data for determination of the dividing ratio to be used by the frequency divider 11.

The adder 13 receives, as an input thereto, a fixed integer value L set in advance and performs an integrating operation of repeating addition of L to an output value of the latch circuit 14. The subtractor 16 receives, as an input thereto, another fixed integer value M, set in advance and larger than L and outputs a result of subtraction of the value M from an output value A of the adder 13 as a value B.

The comparator 17 controls the selector 15 and the selector 12 so that, when the output value B of the subtractor 16 is lower than 0 (zero), the selector 15 may select the value A and the selector 12 may select N, but, when the output value B of the subtractor 16 is equal to or higher than 0 (zero), the selector 15 may select the value B and the selector 12 may select N+1. In other words, the selector 15 selects and outputs the value A when the output value A of the adder 13 is lower than the value M, but selects and outputs the value B when the output value A is equal to or higher than the value M. Meanwhile, the selector 12 selects and outputs N when the output value A of the adder 13 is lower than the value M, but selects and outputs N+1 when the output value A is equal to or higher than the value M.

The latch circuit 14 latches an output value of the selector 15 at a variation point of the output of the frequency divider 11 and outputs the latched value to the adder 13.

As can be seen from the constructions and operation of the components described above, the adder 13, selector 15 and latch circuit 14 construct an integrator which increments, the output value A of the adder 13 by L each time the divided clock signal, which is an output of the frequency divider 11, rises this is performed while the comparator 17 continues to control the selector 15 to select the value A. Meanwhile, the output of the subtractor 16 exhibits a value equal to or higher than 0 or lower than 0 depending upon whether the integrated value A is equal to or higher than M or lower than M. The comparator 17 detects this and controls the selector 15 to select the value A or the value B. If the selector 15 selects the value B, then the value B is a value obtained by subtracting the value M from the value A, and the latch circuit 14 operates so as to be preset to a value obtained by subtracting M from the integrated value.

The foregoing operation resultantly corresponds to comparison of the magnitude of the integrated value A with M by the subtractor 16 and the comparator 17. Since control of the selection signal of the selector 15 when the integrated value A exceeds M, and control of the selection signal of the selector 12 is performed simultaneously, the frequency division of the frequency divider 11 is controlled so that the N+1 division is performed each time the integrated value A becomes equal to or higher than M.

Here, the integrated value A, which is an output of the adder 13, exceeds the value M in a frequency of L samples in M samples. Further, the input clock signal is divided by N+1 by the frequency divider 11 when the integrated value exceeds M. In particular, since a N+1 division occurs in a frequency of L times in M times, the division of the frequency divider 11 is on the average, a N+L/M division and accordingly, a dividing operation of a non-integer having a fraction is performed.

Figure 2:
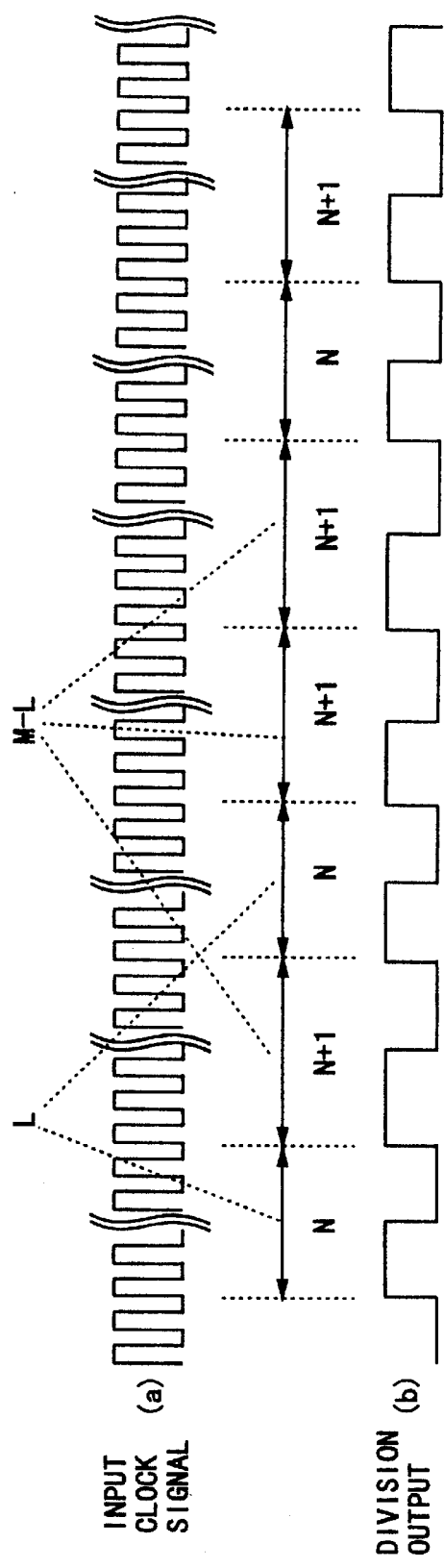
FIG. 2 is a waveform diagram illustrating operation of the fractional frequency divider shown in FIG. 1(C)
Figure 2:
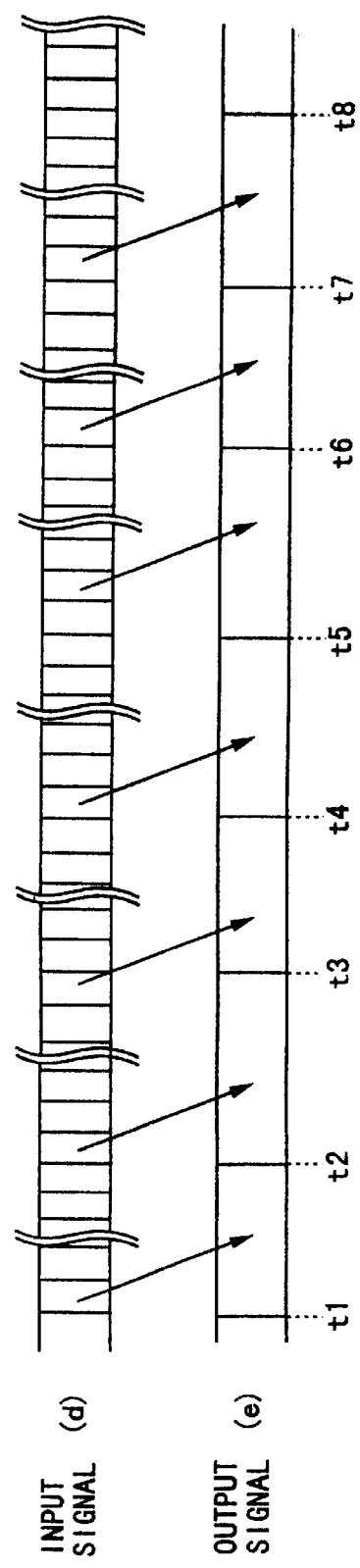

FIG. 2 is a time chart illustrating operation of the fractional frequency dividing circuit when a sampling frequency is converted from a high frequency to a low frequency. Operation of the present embodiment is described in detail with reference to FIG. 2.

Referring to FIG. 2, an input clock signal (a) is a clock signal of a high frequency, and a division output (b) is a clock signal of a low frequency obtained by dividing the input clock signal (a) by means of the frequency divider 11. Meanwhile, an input signal (d) indicates a signal obtained by sampling an input signal to the fractional frequency dividing circuit with a clock signal of the high frequency. Further, an output signal (e) indicates a signal obtained by sampling the input signal (d) with the clock signal of the low frequency to convert the sampling frequency.

Further, an integrated value (c) represents an output value of the adder 13 on the left side of each arrow mark and an output value of the selector 15 on the right side of each arrow mark.

Now, if it is assumed that a frequency dividing operation is started at a point of time t1 at which the output of the latch circuit is 0 and the integrated value (c) of the adder 13 is L, then since L<M, the output value B=L−M of the subtractor 16 is negative, and the selector 12 loads N into the frequency divider 11 and the selector 15 selectively outputs A=L. The frequency divider 11 thus performs N division, and the division output (b) ends the operation of one cycle at the Nth input clock.

At a rising edge of the output of the frequency divider 11 at a point of time t2 of the next cycle, the value L is latched by the latch circuit 14, and the adder 13 outputs the integrated value 2L. Here, if it is assumed that 2L>M, then the subtractor 16 outputs B=2L−M (>0). The comparator 17 detects this, and the selector 12 outputs N+1 and the selector 15 outputs B=2L−M. The frequency divider 11 performs N+1 division and the frequency division output (b) ends one cycle at the N+1th input clock.

At a rising edge of the output of the frequency divider 11 at a point of time t3, the latch circuit 14 latches and outputs 2L−M, and the adder 13 outputs 3L−M and the subtractor 16 outputs B=3L−2M. If it is assumed that 3L−2M<0, then the frequency divider 11 performs an N dividing operation. Thereafter, by similar operation, as seen from the integrated value (c) of FIG. 2, at a point of time t4, A=4L−M, B=4L−2M and the load value is N+1; at another point of time t5, A=5L−2M, B=5L−3M and the load value is N+1; . . . .

By such operation as described above, since the N+1 division occurs in a frequency of L times in M samples, division of the frequency divider 11 is, on the average N+L/M.

In the sampling frequency conversion apparatus of FIG. 1(A), since the input clock signal which is an output of the source oscillator 3 and the frequency division output of the fractional frequency dividing circuit 4 are supplied to the sampling circuit 1 and the sampling circuit 2, respectively, the input signal (d) of FIG. 2 is outputted from the sampling circuit 1 while the output signal (e) of FIG. 2 is outputted from the sampling circuit 2.

On the other hand, in the sampling frequency conversion apparatus of FIG. 1(B), since the relationship of the input and the output is reversed to that of the sampling frequency conversion apparatus of FIG. 1(A), it is apparent that also the outputs of the sampling circuits 5 and 6 are reversed from the relationship described above.

Figure 3A:
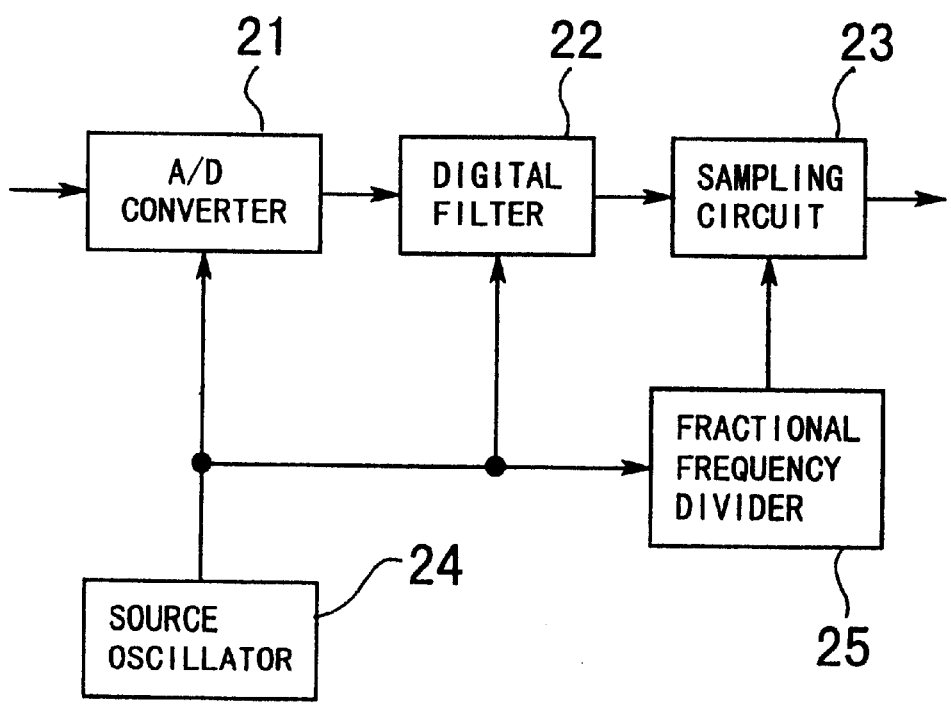
FIG. 3(A) is a block diagram of a further sampling frequency conversion apparatus according to the present invention wherein a sampling frequency is converted from a high frequency to a low frequency.

Referring now to FIG. 3(A), there is shown a further sampling frequency conversion apparatus according to the present invention. In the present sampling frequency conversion apparatus, a signal obtained by sampling with a high frequency is digitally converted and sampled with a low frequency.

An input analog signal is converted into a digital value by an A/D converter 21 using a clock signal of a frequency of a source oscillator 24. An output of the A/D converter 21 is inputted, before it is sampled again with the low frequency, to a digital filter 22 for removing high frequency components from the output of the A/D converter 24. In this stage, the operation clock signal of the frequency of the source oscillator 24 is still used. Then, an output of the digital filter 22 is re-sampled by a sampling circuit 23 with a clock signal obtained by fractionally dividing the output of the source oscillator 24 by means of a fractional frequency divider 25, the final output signal is outputted from the sampling circuit 23 and accordingly from the sampling frequency conversion apparatus.

Figure 3B:
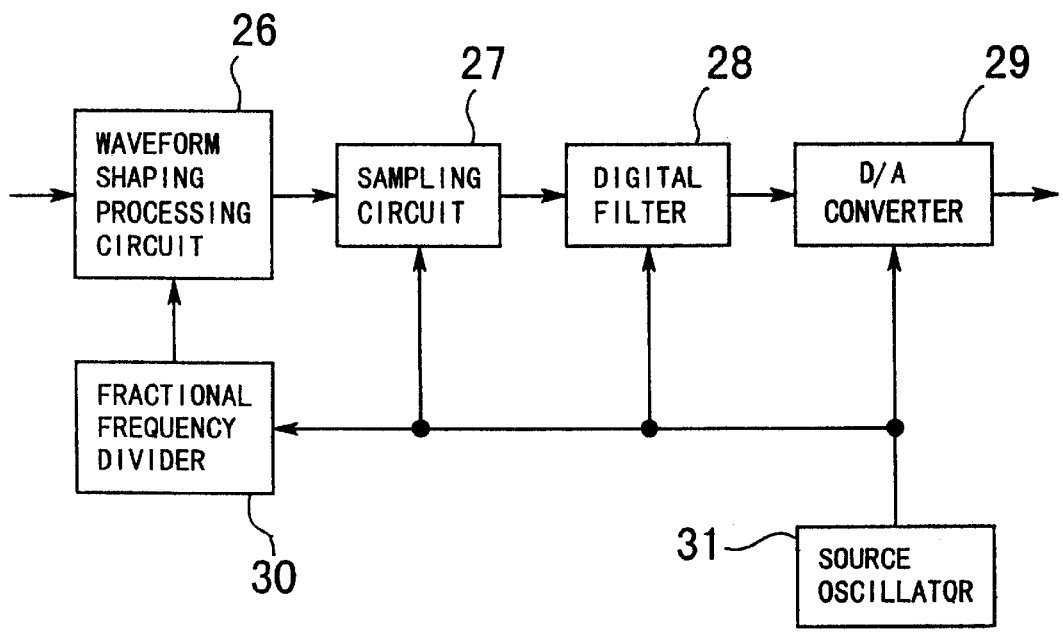
FIG. 3(B) shows a still further sampling frequency conversion apparatus according to the present invention wherein a sampling frequency is converted from a low frequency to a high frequency.
Figure 4:
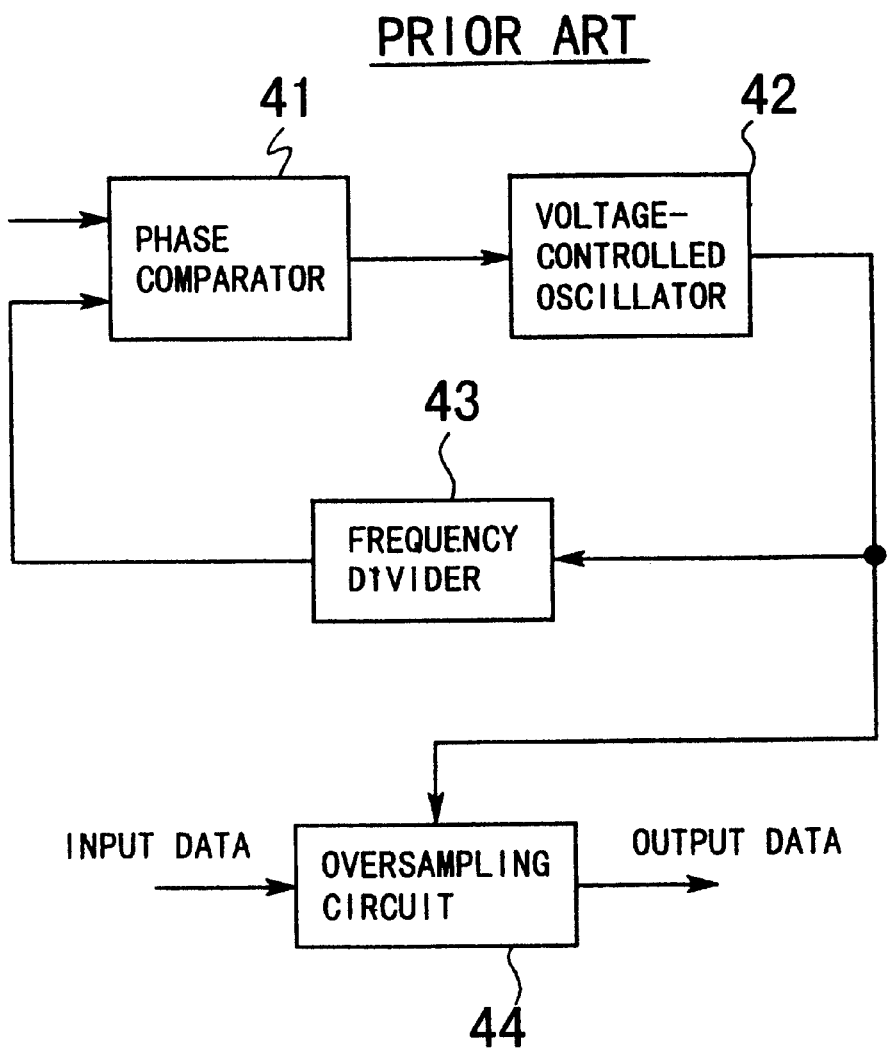
FIG. 4 is a block diagram showing a conventional sampling frequency conversion apparatus.

Meanwhile, FIG. 3(B) shows a still further sampling frequency conversion apparatus according to the present invention. In the present sampling frequency conversion apparatus, a digital signal waveform shaped by digital signal processing with a low frequency is D/A converted with a high frequency to obtain an analog signal.

An input signal is waveform shaped by a waveform shaping processing circuit 26 using an output of a fractional frequency divider 30, as an operation clock signal, to obtain a digital signal. Then, the digital signal is sampled, before it is D/A converted with the high frequency, again with a high frequency of a source oscillator 31 by a sampling circuit 27. Interpolation processing between sampling cycles is performed by a digital filter 28. The digital signal is then converted into an analog signal with the high frequency by and outputted from a D/A converter 29.

Having now fully described the invention, it will be apparent to one of ordinary skill in the art that many changes and modifications can be made thereto without departing from the spirit and scope of the invention as set forth herein.

What is claimed is:

1. A sampling frequency conversion apparatus, comprising:
   an oscillator for generating a first clock signal having a first sampling rate;
   a divider which divides said first clock signal at a non-integer frequency ratio to produce a second clock signal having a second sampling rate which is lower than said first sampling rate;
   a first sampling circuit receiving both an input signal to be sampled and said second clock signal, said first sampling circuit sampling said input signal at said second sampling rate and generating a sampled output as a function thereof; and
   a second sampling circuit receiving both said sampled output and said first clock signal and sampling said sampled output at said first sampling rate.

2. A sampling frequency conversion circuit as claimed in claim 1, wherein said includes:
   a frequency divider which receives and divides said first clock signal,
   a first selector which selectively loads division data to said frequency divider as a value for determination of a dividing ratio, said division data being an integer, and
   a control circuit which controls said first selector in response to an output of said frequency divider so that the dividing ratio is a fraction.

3. The sampling frequency conversion circuit as claimed in claim 2, wherein said control circuit comprises:
   a latch circuit which receives said output of said frequency divider;
   an adder which adds a first constant to an output of said latch circuit and produces an added output in response thereto;
   a subtractor which subtracts a second constant from said added output and produces a subtracted output in response thereto;
   a comparator, which compares said subtracted output with a third constant and produces a control signal in response thereto, said control signal controls said first selector; and
   a second selector which also receives said control signal from said comparator, and which further receives said added output and said subtracted output, said second selector outputting to said latch circuit one of said added output and said subtracted output in response to said control signal.

4. A sampling frequency conversion circuit as claimed in claim 1, wherein a waveform shaping processing circuit is used for said first sampling circuit, said sampling frequency conversion apparatus further comprising a digital filter for filtering an output of said second sampling circuit and a D/A converter for converting an output of said digital filter into an analog signal.

* * * * *